United States Patent [19]

Cameron

[11] 4,195,282

[45] Mar. 25, 1980

[54] CHARGE REDISTRIBUTION CIRCUITS

[75] Inventor: Frank L. Cameron, Wellesley Hills, Mass.

[73] Assignee: GTE Laboratories Incorporated, Waltham, Mass.

[21] Appl. No.: 963,489

[22] Filed: Nov. 24, 1978

Related U.S. Application Data

[63] Continuation-in-part of Ser. No. 874,239, Feb. 1, 1978.

[51] Int. Cl.$^2$ .......................................... H03K 13/02
[52] U.S. Cl. ........................ 340/347 AD; 340/347 M
[58] Field of Search ..... 340/347 M, 347 AD, 347 NT

[56] References Cited

U.S. PATENT DOCUMENTS 4,129,863  12/1978  Gray et al. .................. 340/347 AD

OTHER PUBLICATIONS

Abraham et al, Charge Redistribution Techniques for Multi-Channel PCM Encoding, International Conference on Communications, I.C.C., 12-15, Jun. 1977, pp.
Gray et al, Companded Pulse Code Modulation Voice Codec Using Monolithic Weighted Capacitor Arrays, IEEE Journal of Solid State Circuits, 12/1975, pp. 497-499.
Tsividis, Gray et al, An All-MOS Companded PCM Voice Encoder, IEEE International Solid-State Circuits Conference, 2/18/1976, pp. 24, 25.
Tsividis et al, A segmented $\mu$-255 Law PCM Voice Encoder Utilizing NMOS Technology, IEEE Journal of Solid-State Circuits, vol. SC-11, No. 6, 12/1976, pp. 740-747.
McCreary et al, All-MOS Charge Redistribution Analog-to-Digital Conversion Techniques, Part I, IEEE Journal of Solid-State Circuits, vol. SC-10, 12/1975, pp. 371-379.
Suarez et al, All-MOS Charge Redistribution Analog-to-Digital Conversion Techniques, Part II, IEEE Journal of Solid-State Circuits, vol. SC-10, No. 6, 12/1975, pp. 379-385.

Henning et al, D2 Channel Bank:System Aspects, B.S.T.J., 10/1972, pp. 1641-1657.

*Primary Examiner*—Thomas J. Sloyan
*Attorney, Agent, or Firm*—Fred Fisher

[57] ABSTRACT

A charge redistribution circuit for pulse code modulation encoding suitable for use in apparatus for encoding voice in a companded code to maximize signal-to-noise performance. The companded code is the fifteen segment approximation of the $\mu 255$ compression law, wherein each segment contains 16 equal size steps. The circuit includes a single binary weighted capacitor array for the generation of both segment and step boundaries of voice being encoded. Each capacitor in the array has a pair of opposed plates, one plate of each capacitor being commonly coupled together. The circuit further includes a binary comparator having a first input adapted to be coupled to a reference bias potential and a second input coupled to the commonly coupled plates. First switching means connect and disconnect the commonly coupled plates to and from ground potential. Second switching means selectively connect a first common line to an input analog voice signal or to ground potential. Third switching means selectively connect a second common line to a predetermined reference voltage $V_{ref}$ or to a reference voltage $V_{ref/16}$ (which is 1/16 the predetermined voltage), and selectively couple the first comparator input to ground potential or to the reference bias potential. Fourth switching means, including a switch for each capacitor, selectively couple the other plates of the capacitors to the first or to the second common line. An eight-bit code generator provides a digital eight-bit output upon receipt of a read instruction and control logic for controlling the four switching means, such logic being responsive to the output of the comparator and providing control signals to the generator. Simultaneously, it causes the third switching means to connect the first comparator input to ground when the sampled input signal lies in the upper four segments and it causes the third switching means to connect the first comparator input to a reference bias potential when the sampled input signal lies in the lower four segments.

9 Claims, 6 Drawing Figures

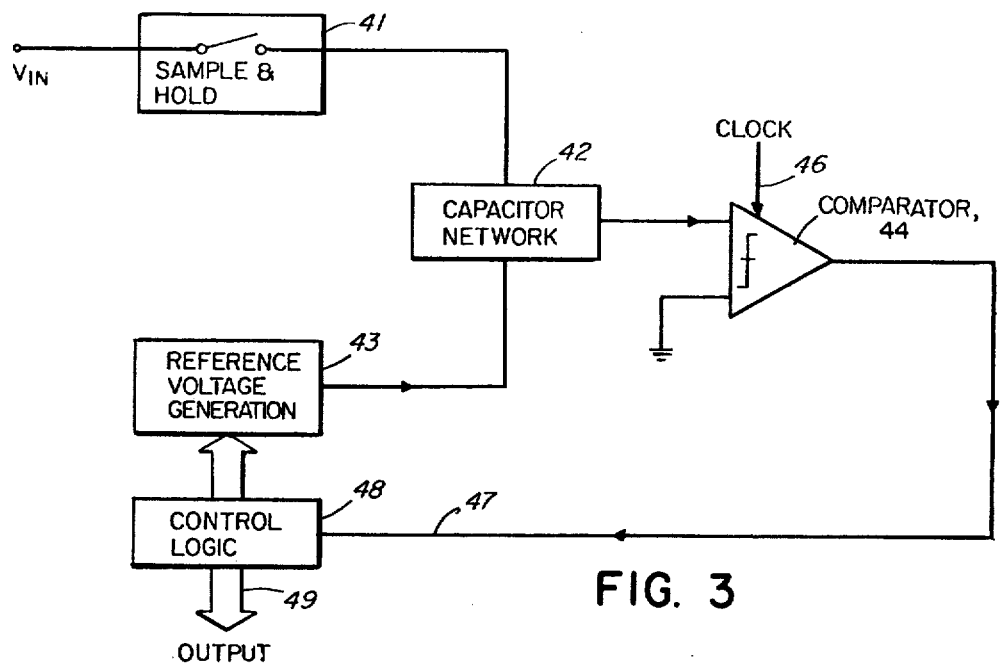
FIG. 3
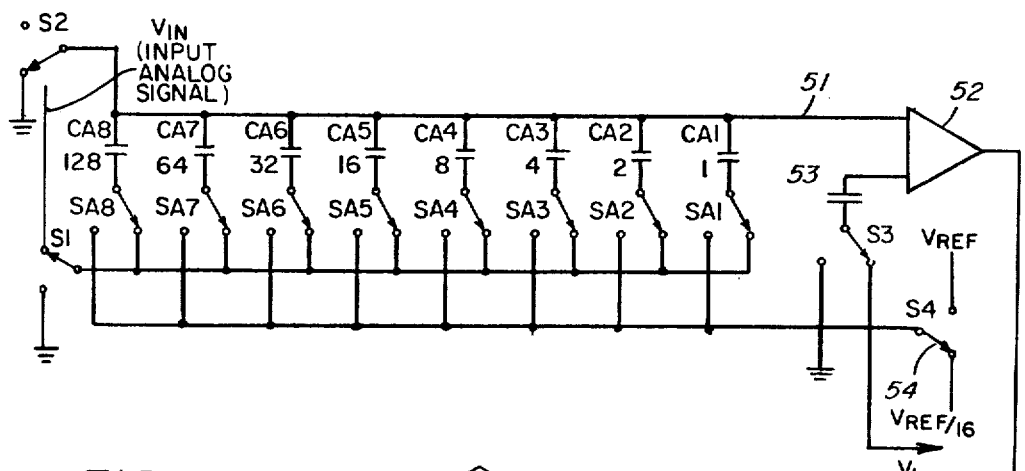
FIG. 4
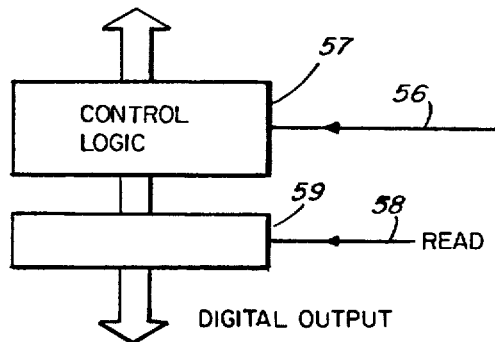

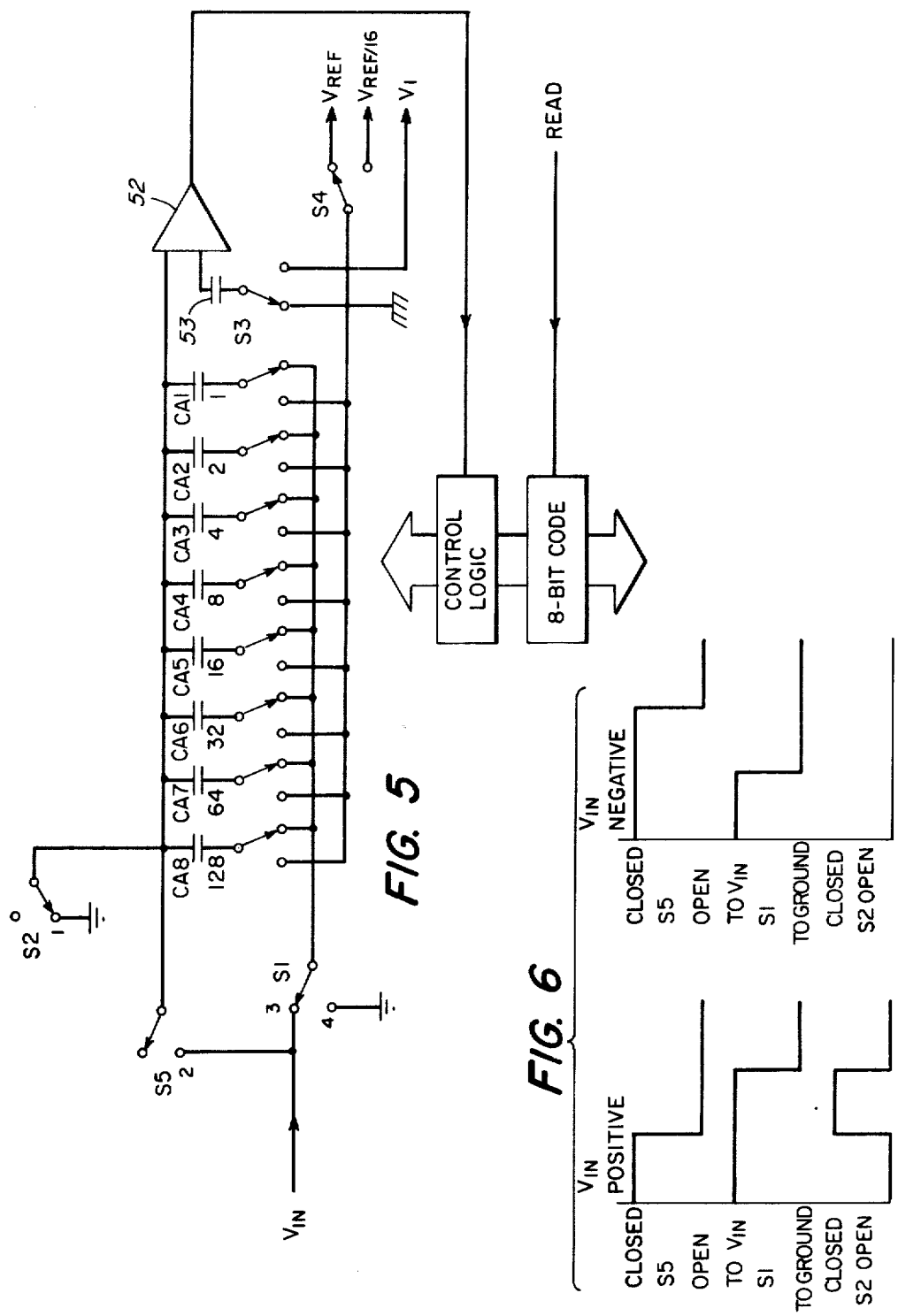

CHARGE REDISTRIBUTION CIRCUITS

CROSS-REFERENCE TO RELATED APPLICATION

This application is a continuation-in-part of application Ser. No. 874,239, filed Feb. 1, 1978, entitled "Charge Redistribution Circuits".

BACKGROUND OF THE INVENTION

1. Field of the Invention

This invention relates to new and improved charge redistribution circuitry for pulse code modulation encoding and, in particular, to such circuitry for use in apparatus for encoding voice in a companded code to maximize signal-to-noise performance. Accordingly, it is a general object of this invention to provide a new and improved circuit of such character.

2. Description of the Prior Art

Voice signals can be coded in a nonlinear digital code for digital telephone transmission in order to maintain a high ratio of signal-to-noise over a wide range without requiring excessive digital transmission bandwidth. One widely used code in the United States is the 15 segment approximation of the $\mu=255$ compression law. An analog signal, such as speech, can be converted into a digital coded output using an 8-bit pulse code modulation format in which, in each of the 15 segments, there are 16 equal steps, with the exception of the segment passing through the origin which contains 31 equal steps. In such case, a standard sampling rate for voice signals is 8 KHz, resulting in a 64 kilobits PCM signal.

Coders implementing such code have been relatively complex. For economic reasons, the coder/decoder (codec) is often shared over 24 or more channels through the use of analog multiplexers at the input and output. However, in many cases, a low cost codec per channel offers advantages. Recognition thereof has led to extensive studies of alternative codes, particularly linear and adaptive delta modulation which allow particularly simple codec hardware implementations. Drawbacks to delta modulation are its incompatability with standard PCM, and poor performance for data transmission.

A $\mu 255$ PCM voice encoder which is amenable to onchip monolithic realization in standard MOS technology has been proposed in the prior art. Such a coder includes some elements found in linear A/D converters suggested by others. The prior art encoder includes two binary-weighted capacitor arrays as the key precision elements. Other elements include a binary comparator, a near unity gain buffer amplifier with very high input impedance, a reference source $V_R$, and numerous analog switches. Binary sequencing and control logic totalling about 60 gates and flip-flops and a digital clock are required. A negative reference can be developed by a sub-circuit, so that only a single positive reference is required in the main circuitry. Further description of such a proposed coder is discussed hereinafter following the "Brief Description of the Drawings" under description of a "Prior Art PCM Coder".

SUMMARY OF THE INVENTION

A disadvantage of prior art coding of companded pulse code modulation is that the implementation of the step voltage settings is achieved by means of a lower or step capacitor array feeding a unity gain buffer amplifier. One of the main constraints permits the time required for the full encoding cycle to include the charging of the top and bottom capacitor arrays and the settling time of the buffer amplifier and comparator circuits. Thus, it is another object of this invention to provide a new and improved charge redistribution circuit which is faster than similar circuits of the prior art.

Yet another object of this invention is to provide a new and improved charge redistribution circuit for use as a shared multi-channel analog-to-digital encoder for pulse code modulation use in which the encoding cycle can be completed within $1/m \times 125$ microseconds for multichannel encoding (i.e., for m channels).

Still yet another object of this invention is to provide a new and improved charge redistribution circuit in which faster operation than similar devices of the prior art obtained.

Another object of this invention is to provide a new and improved charge redistribution circuit which need utilize reference voltage generation of but one polarity.

Yet still another object of this invention is to provide a new and improved charge redistribution circuit which can be produced on a monolithic large scale integrated circuit device using a minimal amount of die area.

In accordance with one embodiment of the invention, a charge redistribution circuit for pulse code modulation encoding is provided. Such circuit is suitable in apparatus for encoding voice in a companded code to maximize signal-to-noise performance. The companded code is the 15 segment approximation of the $\mu 255$ compression law, each segment containing 16 equal size steps. The circuit includes a single binary weighted capacitor array for the generation of both segment and step boundaries of voice being encoded. Each capacitor of the array has a pair of opposed plates. One plate of each capacitor is commonly coupled together. The circuit further includes a binary comparator having a first input adapted to be coupled to a reference bias potential and a second input coupled to the commonly coupled plates of the capacitor array. A first switching means connects the commonly coupled plates to ground potential and disconnects the plates therefrom. The circuit further includes second switching means for selectively connecting a first common line to an input analog voice signal or to ground potential. Further included is a third switching means for selectively connecting a second common line to a predetermined reference voltage $V_{ref}$ or to a reference voltage $V_{ref/n}$ which is $1/n$th the predetermined voltage, and for selectively coupling the first comparator input to ground potential or to the reference bias potential. The circuit also includes fourth switching means including a switch for each of the capacitors which selectively couples the other plates of each of the capacitors of the array to the first common line or to the second common line. Code generating means provide a digital output (e.g., eight bits) upon receipt of a read instruction and control signals applied thereto. Control logic means control the four switching means which are responsive to the output of the comparator and provide control signals through the generating means. In accordance with certain features of the invention, $n=16$. In accordance with one embodiment of the invention in sequence: (1) The control logic means causes the first switching means to connect the commonly coupled plates to ground potential, causes the fourth switching means to couple the other plates to the first common line, and causes the second switching means to connect the first common line to the receiving means, whereby the analog voice signal can be sampled and held as a charge stored on the capacitor array. (2) The control logic means causes the first switching means to disconnect the commonly connected plates from ground potential, and causes the second switching means to connect the first common line to ground potential so that the sign of the voltage on the second input of the comparator, as detected by the comparator, is the negative of the sign of the sampled analog voice signal, thereby determining the polarity and sign bit of the pulse code modulation. (3) The control logic means causes the third switching means to connect the second common line to the predetermined reference voltage $V_{ref}$, and causes the fourth switching means to superimpose a reference voltage equivalent to the top of segment 4 to the commonly coupled plates of the capacitor array by connecting the four lower value capacitors to the second common line as an initial sequence of a standard three sequence segment-selection successive approximation algorithm while the remainder of the array remains coupled to ground. (4) The control logic means causes the third switching means to continue to connect the second common line to the predetermined reference voltage $V_{ref}$ when the sampled input signal lies in the upper four segments, and it causes the third switching means to connect the second common line to the reference voltage $V_{ref/16}$ when the sampled input signal lies in the lower four segments. Simultaneously, it causes the third switching means to continue to connect the first comparator input to ground when the sampled input signal lies in the upper four segments; and it causes the third switching means to connect the first comparator input to a reference bias potential when the sampled input signal lies in the lower four segments. It further causes the fourth switching means as part of the second sequence of the standard three sequence segment-selection successive approximation algorithm to superimpose either a reference voltage equivalent to the top of segment 6 or segment 2 to the commonly coupled plates of the capacitor array, dependent upon whether the reference voltage $V_{ref}$ or the reference voltage $V_{ref/16}$, respectively, is coupled to the second common line of the capacitor array as a second sequence of a standard three sequence successive approximation algorithm for segment determination. (5) The control logic means causes the fourth switching means to superimpose a reference voltage equivalent to the top of segments 7 or 5, dependent on the polarity of the comparator output, to the commonly coupled plates of the capacitor array, for the predetermined reference voltage $V_{ref}$, coupled to the second common line of the capacitor array, by connecting the lower 7 or 5 value capacitors to the second common line as a third sequence of a standard three sequence successive approximation algorithm for segment determination. Alternatively, the control logic means causes the fourth switching means to superimpose a reference voltage equivalent to the top of segments 3 or 1, dependent on the polarity of the comparator output, to the commonly coupled plates of the capacitor array, for the predetermined reference voltage $V_{ref/16}$, coupled to the second common line of the capacitor array, by connecting the lower 7 or 5 value capacitors to the second common line as a third sequence of a standard three sequence successive approximation algorithm for segment determination. (6) The control logic means causes the fourth switching means to superimpose a reference voltage to said commonly coupled plates of the capacitor array equivalent to the top of the eighth or middle step within the segment determined in the previous sequence, either by retaining unchanged the highest capacitor switched to the second common line, while concurrently causing the capacitor lower in value than the highest valued capacitor connected to the second common line to be switched to the first common line, or, dependent on the polarity of the comparator output at the end of said previous sequence, by causing the highest valued capacitor connected to the second common line to be switched to the first common line while concurrently connecting the next highest capacitor to the second common line, said switching of the fourth switching means being an initial sequence of a standard four sequence successive approximation algorithm for step determination. (7) Depending upon the polarity of the output of the comparator at the end of the previous sequence, the control logic means either causes the fourth switching means to superimpose a reference voltage equivalent to the top of step 4 of the predetermind segment to the commonly coupled plates of the capacitor array by switching the next two highest capacitors below the highest capacitor switched to the second common line in the previous sequence to the first common line, or the control logic means causes the fourth switching means to superimpose a reference voltage equivalent to the top of step 12 of the predetermined segment to the commonly coupled plates of the capacitor array by switching the next highest capacitor below the highest capacitor switched to the second common line in the previous sequence to the second common line, concurrently switching the second highest capacitor below the highest capacitor switched to the second common line in the previous sequence to the first common line as a second sequence of the standard four sequence successive approximation algorithm for step determination. The algorithm for the four sequence step determination provides the relationship between the number of the step n with in the predetermined segment whose reference voltage equivalent is switched to the commonly coupled plates of the capacitor array to the switching state of the four capacitors below the highest value capacitor switched to the second common line in the final segment determination sequence and is defined as:

$$n = 16\left(1 - \frac{k_1}{2^1} - \frac{k_2}{2^2} - \frac{k_3}{2^3} - \frac{k_4}{2^4}\right)$$

When $k_a = k_1, k_2, k_3, k_4 = 1$, The $a^{th}$ capacitor below the highest value capacitor switched to the second common line in the previous sequence is switched to the first common line. When $k_a = k_1, k_2, k_3, k_4 = 0$, the $a^{th}$ capacitor below the highest value capacitor switched to the second common line in the previous sequence is switched to the second common line. (8) The control logic means cause the fourth switching means to superimpose a reference voltage equivalent to the top of steps 2, 6, 10 or 14 of the predetermined segment to the commonly coupled plates of the capacitor array as a third sequence of the standard four sequence successive approximation algorithm for step determination as defined in the previous section (7). (9) The control logic means causes the fourth switching means to superimpose a reference voltage equivalent to the top of steps 1, 3, 5, 7, 9, 13 or 15 of the predetermined segment to the commonly coupled plates of the capacitor array as a fourth and final sequence of the standard four sequence successive approximation algorithm for step determination as defined in the previous section (7). (10) The control logic means causes the circuit to present an eight-bit digitally encoded output word and to reset for subsequent pulse code modulation encoding.

In accordance with a preferred embodiment of this invention, an improved sample and hold circuit provides for the same polarity of sampled signal, irrespective of the polarity of the input signal, thus obviating the need for reference voltage supplies of both polarities and the need for close voltage matching between these supplies. In accordance with such embodiment, the circuit includes a fifth switching means for selectively connecting and disconnecting the receiving means with the commonly coupled plates, the control logic means controlling the fifth switching means.

BRIEF DESCRIPTION OF THE DRAWINGS

Other objects, advantages, and features of this invention, together with its construction and mode of operation, will become more apparent from the following description when read in conjunction with the accompanying drawings, in which:

FIG. 3 is a simplified diagram of a charge redistribution encoding system;

FIG. 4 is a diagram of a charge redistribution circuit for PCM encoding in accordance with one embodiment of the invention;

FIG. 5 is a diagram of a charge redistribution circuit for PCM encoding in accordance with a preferred embodiment of the invention utilizing a modified sample and hold circuit; and FIG. 6 is a diagram illustrating the timing of some switches of the circuit shown in FIG. 5.

PRIOR ART PCM CODER

A proposed design for a standard 15 segment approximation to the μ255 compression law coder for pulse-code modulation telephony was presented by Paul R. Gray, David A. Hodges, John P. Tsividis and Jacob Chacko, Jr., in an article entitled "Companded Pulse-Code Modulation Voice Codec Using Monolithic Weighted Capacitor Arrays", in the *IEEE Journal of Solid State Circuits*, December, 1975, pp. 497-499.

Figure 1:
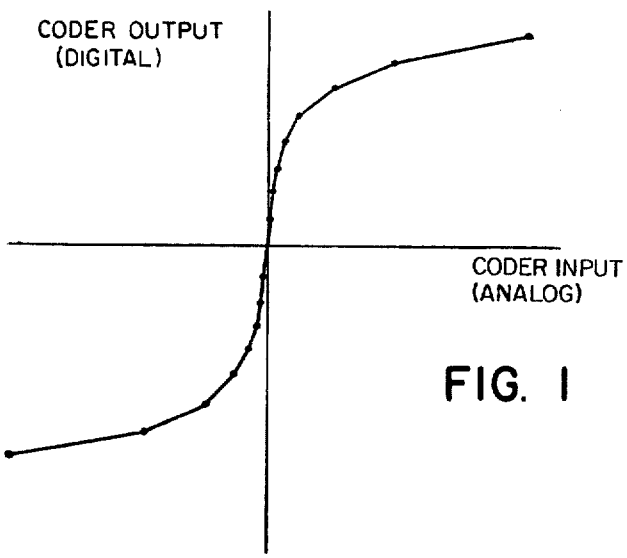
FIG. 1 is a diagram illustrating a 15 segment piecewise linear approximation to the μ255 compression law.

The fifteen segment approximation of the μ255 compression is shown in FIG. 1. Note that there are seven complete segments in the upper right quadrant and seven complete segments in the lower left quadrant, with one segment going through the origin.

Figure 2:
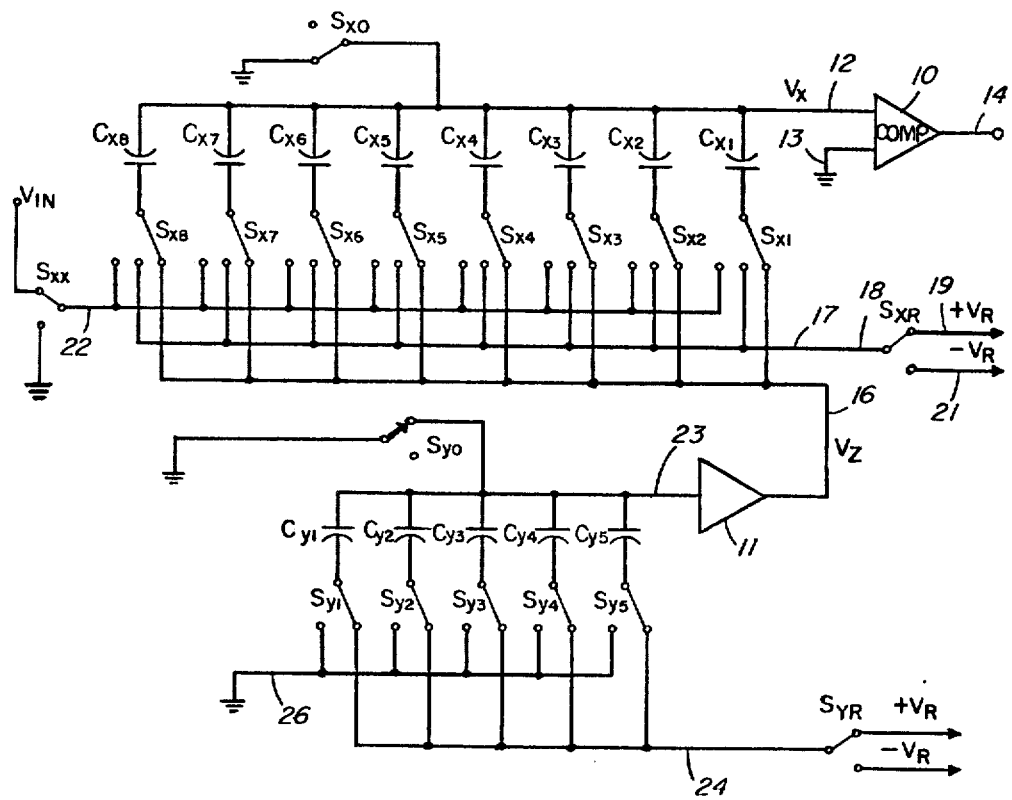
FIG. 2 is a diagram of a conceptual schematic of a charge redistribution of μ255 encoder of the prior art.

The proposed coder of Gray et al., diagrammed in FIG. 2, utilizes two binary-weighted capacitor arrays, $C_{xi}$ and $C_{yi}$ as the key precision elements. Other elements shown in FIG. 2 include a binary comparator 10, a near unity gain buffer amplifier 11 with very high input impedance, reference sources $+V_R$ and $-V_R$ and numerous analog switches. Binary sequencing and control logic totalling about sixty gates and flip flops, and a digital clock (not shown), are required.

Referring to FIG. 2, the comparator 10 has a pair of input lines 12, 13 coupled thereto and an output line 14. The input line 13 is coupled to a point of reference potential, such as ground.

The input line 12, which carries a signal $V_X$, is coupled to an arm of a single-pole double-throw switch $S_{X0}$, one position of the arm being such as to couple the line 12 to a point of reference potential such as ground, the other position thereof being such as to keep the line 12 from being coupled to such reference potential.

The line 12 is commonly coupled to one plate of each of a plurality of capacitors $C_{X1}$, $C_{X2}$, $C_{X3}$, $C_{X4}$, $C_{X5}$, $C_{X6}$, $C_{X7}$ and $C_{X8}$.

The remaining plates of the capacitor $C_{X1}$, $C_{X2}$, $C_{X3}$, $C_{X4}$, $C_{X5}$, $C_{X6}$, $C_{X7}$, $C_{X8}$ are coupled, respectively, to arms of three-position switches $S_{X1}$, $S_{X2}$, $S_{X3}$, $S_{X4}$, $S_{X5}$, $S_{X6}$, $S_{X7}$, $S_{X8}$, respectively. A first contact position for each of the switches $S_{X1}$, $S_{X2}$, $S_{X3}$, $S_{X4}$, $S_{X5}$, $S_{X6}$, $S_{X7}$, and $S_{X8}$ are coupled jointly to each other to a line 16 upon which a signal $V_Z$ is impressed, which is coupled to the output of a near-unity gain buffer 11.

Intermediate contacts for each of the switches $S_{X1}$, $S_{X2}$, $S_{X3}$, $S_{X4}$, $S_{X5}$, $S_{X6}$, $S_{X7}$, $S_{X8}$ are jointly coupled, respectively, to a common line 17 which is connected to an arm 18 of $S_{XR}$ which can be selectively positioned between a line 19 which is coupled to a voltage source $+V_R$, and to a line 21 which is coupled to voltage source $-V_R$.

The third contacts for each of the switches $S_{X1}$, $S_{X2}$, $S_{X3}$, $S_{X4}$, $S_{X5}$, $S_{X6}$, $S_{X7}$, $S_{X8}$ are jointly connected together, respectively, to a line 22 which is coupled to an arm of a single-pole double-throw switch $S_{XX}$, which can be switched between a point of reference potential, such as ground and in input voltage $V_{IN}$.

An arm of a single-pole double-throw switch $S_{Y0}$ is coupled to a point of reference potential, such as ground. One position of the switch $S_{Y0}$ is unconnected; the remaining position is connected to a line 23 which is coupled to the input of the near-unity gain buffer 11.

The line 23 is coupled jointly to one plate of each capacitor $C_{Y1}$, $C_{Y2}$, $C_{Y3}$, $C_{Y4}$, $C_{Y5}$. The other plates of the capacitors $C_{Y1}$, $C_{Y2}$, $C_{Y3}$, $C_{Y4}$, $C_{Y5}$ are coupled, respectively, to an arm of single-pole double-throw switches $S_{Y1}$, $S_{Y2}$, $S_{Y3}$, $S_{Y4}$, $S_{Y5}$. One contact of each of the switches $S_{Y1}$, $S_{Y2}$, $S_{Y3}$, $S_{Y4}$ and $S_{Y5}$ are jointly coupled together to a line 24 which is coupled to an arm of a single-pole double-throw switch $S_{YR}$. The arm of the switch $S_{YR}$ can be selectively coupled between a voltage source $+V_R$ and a voltage source $-V_R$.

The other contact of each of the switches $S_{Y1}$, $S_{Y2}$, $S_{Y3}$, $S_{Y4}$, $S_{Y5}$ are coupled together to a common line 26 which is coupled commonly to a point of reference potential, such as ground.

The conversion proceeds as follows: Initially, the switch $S_{X0}$ is thrown to ground, and the switches $S_{X1}$ through $S_{X8}$ are positioned to receive the voltage source $V_{IN}$ (through the switch $S_{XX}$). The voltage $V_{IN}$ is thus stored on the capacitors $C_{X1}$ through $C_{X8}$. Next, the switch $S_{X0}$ is opened, and the switches $S_{X1}$ through $S_{X8}$ are thrown to ground (through the switch $S_{XX}$). Ideally, the sign of the voltage $V_X$, as detected by the comparator 10, is the negative of the sign of $V_{IN}$. This determines the sign bit of the PCM code. Also, the process just described, in effect, samples the signal, and the capacitor array is used as a holding capacitor. Next, the segment is determined by successively throwing $S_{Xi}$ in order, starting with $S_{X1}$, from ground to the reference voltage until the sign of $V_X$ changes. (These switches are thrown to $+V_R$ if the sign of $V_{IN}$ was previously determined to be positive, and to $-V_R$ if it was determined to be negative). If, for example, the comparator output changes after the switch $S_{Xn}$ is thrown, this would indicate that the input voltage lies within the nth segment (counting from the right) indicated in FIG. 1.

The final stage in the conversion is the determination of the step within the segment. The capacitor array $C_{Yi}$ is used in this process. Initially, the switches $S_{Yi}$ are all thrown to ground; that switch $S_{Yi}$ which was last thrown in the previous step is now switched to the voltage $V_Z$.

Next, the switch $S_{Y0}$ is opened and the switches $S_{Y1}$ through $S_{Y5}$ are thrown sequentially from ground to $V_R$. The successive approximation algorithm is used for the in-chord coding, so that four clock periods are required to decide within which of the sixteen steps the sample lies. The setting of the switch $S_{Yi}$ at this point denotes the step within the segment and the conversion is complete.

DESCRIPTION OF ONE EMBODIMENT OF THE INVENTION IN GENERAL

Applicant's new approach to encoding by charge redistribution techniques is set forth which uses only a single capacitor bank for both segment and step selection and is capable of handling a number of channel inputs on a time-shared basis. The design of the single capacitor bank approach in a large scale integrated circuit implementation is consistent with multi-channel encoding speed requirements.

INTRODUCTION

Single channel charge redistribution encoder/decoder techniques, using the storage and switching of charge on capacitors, have been described for companded PCM encoding use by P. R. Gray, et al. as set forth hereinabove. Such techniques use binary-weighted precision capacitor arrays which can readily be implemented in NMOS technology and realized in LSI monolithic form. For single channel application, encoding speed is generally not critical since a full 125 microseconds is available. However, for multi-channel application (shared codec), encoding speed is critical and attention should be given to the influence of each circuit element on the total encoding delay.

Thus, it is an object of this invention to provide new and improved circuitry which achieves faster encoding and provides for a new charge redistribution configuration for encoding a number of channels on a time-shared basis.

MULTI-CHANNEL ENCODING

Encoding speed is a function of the number of switching sequences required to encode a sample. For PCM applications, voice is often coded in a nonlinear or companded code to maximize the overall signal-to-noise performance. The companded law most generally used in the U.S.A. is a fifteen segment approximation of the $\mu255$ compression law. Each segment contains sixteen equal-size steps. For PCM encoding purposes, the required switching sequences or time slots per sample may be considered as:

| | |
|---|---|
| (a) Sample and Hold | One time slot. |
| (b) Polarity determination | One time slot. |
| (c) Segment selection | Three time slots. |
| (d) Step selection | Four time slots. |
| (e) Output data strobe and general circuit re-set | One time slot. |
| Total: | ten time slots. |

In the charge redistribution technique, encoding circuit delay and therefore multi-channel capability is a function of the overall loop delay of the circuit shown in simplified form in FIG. 3.

As shown in FIG. 3, the input signal $V_{IN}$ to be sampled is coupled through a sample and hold circuit 41 to one input of a capacitor network 42. Reference voltage generation circuitry 43 is coupled to a second input to the capacitor network 42. The output of the capacitor network 42 is coupled to one input of a comparator 44, the other input thereof being coupled to a point of reference potential, such as ground. The comparator 44 is clocked by an appropriate clock signal 46. The output of the comparator 44 is coupled along a line 47 to control logic circuitry 48 which provides control signals to the reference voltage generation means 43, and also provides signals along output lines 49.

As shown in FIG. 3, the input signal $V_{IN}$ is sampled by the means 41 and is subtracted from successively derived reference voltages. The difference is compared to a nominal ground reference potential. The delay elements in the loop shown in FIG. 3 are:
 (a) Charge redistribution (CR) encoding delay (this includes reference voltage generation and capacitor switch resistance circuit delay).
 (b) Comparator circuit delay.
 (c) Control logic circuit delay.

It is desirable in order to achieve the minimum encoding delay that the elements of the encoding loop be kept as simple as possible. Overall allowable delay for an eight channel analog to digital conversion is approximately 15.5 microseconds per sample. Individual segment and step sequences must therefore be complete within 1.55 microseconds, assumming the encoding sequences as discussed above.

CR ENCODING (REFERENCE VOLTAGE GENERATION)

Analog to digital converters, described above, use binary weighted capacitor arrays and a charge redistribution technique. The approach involves a sample and hold sequence followed by a succession of comparisons of the sampled signal with switched reference voltages representing the boundary levels of the segments and the steps within the segment of the fifteen segment $\mu255$ companded law. Much of the circuitry and associated delay of the encoder is in fact involved in generating these reference voltages. In the encoder to be described in detail hereinafter, the comparison voltages are derived by capacitive division using a single binary-weighted capacitor array for the generation of both the segment and step boundaries. Compared with earlier approaches, this technique avoids the use of circuitry which would otherwise add to the delay and complexity of the encoder.

REFERENCE VOLTAGE REQUIREMENTS

Segment and step upper boundary level requirements can be derived in terms of step units normalized to 8159 as suggested by H. H. Henning and J. W. Pan in an article entitled "D2 Channel Bank: System Aspects", BSTJ, pp. 1641-1657 (October 1972). If $L_{k,n}$ is defined as the height of the $[16-n]^{th}$ step within the kth segment, then $$L_{k,n} + 1 = \left[ 2^4 \sum_{1}^{k} 2^i \right] - 2^k \cdot n$$

Note that for $1 \leq k \leq 8$ and $1 \leq n \leq 15$, the series function will start with the term $2^{k+4}$ for all values of k. Also, the step correction term can be expressed as:

$$2^k n = 2^{k+3} p_i + 2^{k+2} q_i + 2^{k+1} r_i + 2^k s_i$$

where:

$p_i, q_i, r_i, s_i = 0, 1$

This implies that step correction can be achieved for $5 \leq k \leq 8$ by using combinations of the four terms of the series function below the highest term $2^{k+4}$. Furthermore, step correction in this manner requires a minimum of five terms (i.e., $5 \leq k \leq 8$). For segments 1, 2, 3, 4, it can be readily shown that:

$$L_{k=a,n} + 31 = 2^{-4}[L_{k=a+4,n} + 1]$$

where $1 \leq a \leq 4$.
For example, $$L_{k=4,n} + 31 = 2^{-4}[L_{k=8,n} + 1]$$

This allows step correction to be obtained for segments 1, 2, 3, and 4 using series functions equivalent to segments 5, 6, 7, 8 and the step correction process described above. In this case, however, a constant multiplier ($2^{-4}$) and correction term (+31) are required.

CIRCUIT IMPLEMENTATION

In a practical circuit implementation of this encoding approach, the segment and step boundary voltage levels $V_{k,n}$ can also be expressed in terms of a maximum reference voltage level $V_{REF}$ equivalent to the top of segment 8 such that:

$$V_{k,n} = \frac{L_{k,n}}{L_{k=o,n=o}} V_{REF}$$

Or, approximately, $$V_{k,n} = V_{REF} \frac{\left[ (2^4 \sum_{1}^{k} 2^i) - 2^k n \right]}{\left[ 2^4 \sum_{1}^{8} 2^i \right]} \quad \text{for } k = 5, 6, 7 \text{ or } 8$$

$$V_{k,n} = \frac{V_{REF}}{16} \cdot \frac{\left[ \left( 2^4 \sum_{1}^{k+4} 2^i \right) - 2^{k+4} n \right]}{\left[ 2^4 \sum_{1}^{8} 2^i \right]} - V_{REF} \left( \frac{31}{8159} \right)$$

for $k = 1, 2, 3,$ or 4

The worse case error introduced by the foregoing approximation is 3% of the individual step heights within the 5th and 1st segments and correspondingly less for other segments. These errors are well within the practical accuracy of the circuit.

FIG. 4 illustrates a practical circuit of an encoder using a single capacitor ladder array for both segment and step selection in this manner.

The capacitor array $C_{A1}$, $C_{A2}$, $C_{A3}$, $C_{A4}$, $C_{A5}$, $C_{A6}$, $C_{A7}$, $C_{A8}$ includes eight capacitors which are binary weighted in the order 1, 2, 4, 8, 16, 32, 64, 128. One plate of each capacitor $C_{A1}$ through $C_{A8}$, respectively, is commonly coupled together to a line 51. The line 51 is coupled to one input of a comparator 52, the other input being coupled through a capacitor 53 to an arm of a single-pole double-throw switch $S_3$. The line 51 is coupled to the arm of a single-pole double-throw switch $S_2$.

The other plates of the capacitor array $C_{A1}$ through $C_{A8}$, respectively are coupled to arms, respectively, of single-pole double-throw switches $S_{A1}$, $S_{A2}$, $S_{A3}$, $S_{A4}$, $S_{A5}$, $S_{A6}$, $S_{A7}$, $S_{A8}$.

One contact, respectively, of all the switches $S_{A1}$ through $S_{A8}$ are jointly coupled together to the arm of a single-pole double-throw switch $S_1$. The other contacts of the switches $S_{A1}$ through $S_{A8}$, respectively, are jointly coupled together to the arm of a single-pole double-throw switch $S_4$.

The switch $S_1$ can be selectively coupled between a point of reference potential, such as ground, and a voltage source $V_{IN}$ (input analog signal).

The switch $S_2$ can be selectively switched between a point of reference potential, such as ground, and an open circuit.

The switch $S_3$ can be selectively switched between a point of reference potential and a voltage source $V_1$.

The switch $S_4$ can selectively be switched between a reference voltage $V_{REF}$ and a reference voltage $V_{REF}/16$.

The output of the comparator 52 is coupled along a line 56 to control logic means 57.

A read signal, along the line 58, is coupled to means 59 which provides a digital output therefrom. The means 59 and the control logic means 57 are interconnected. The control logic means 57 also provides signals which controls the various switches $S_1$, $S_2$, $S_3$, $S_4$ and the array switches $S_{A1}$ through $S_{A8}$, respectively.

As stated hereinabove, the capacitors of the capacitor array $C_{A1}$ through $C_{A8}$ are binary weighted as indicated. By switching the lower plates (see FIG. 4) of selected capacitors to $V_{REF}$, for example, differing comparison voltages are derived at the input to the comparator 52 by capacitive division. Thus, if $C_s$ is the total capacity switched to $V_{REF}$ and $C_{TOT}$ is the total array capacity $$\frac{L_{k,n}}{L_k = 8, n = 0} = \frac{C_S}{C_{TOT}} = \frac{\left[ \left( 2^4 \sum_{1}^{k} 2^i \right) - 2^k n \right]}{2^4 \sum_{1}^{8} 2^i}$$

Test results of a circuit such as that shown in FIG. 4, using discrete devices, have demonstrated that the new encoding technique provides accurate segment and step selection for companded PCM encoding at higher encoding rates.

The sample and hold and polarity determination modes (modes 1 and 2) proceed as reported in the prior art, such as, for example, by Gray et al., supra.

Mode 3 now involves the derivation of the comparison voltages by connecting one or more of the capacitors to $V_{REF}$ (or $V_{REF}/16$) while the remainder of the array remains connected to ground using a standard three sequence successive approximation algorithm.

In the first of this sequence, the capacitors $C_{A1}$ through $C_{A4}$ are switched to $V_{REF}$ superimposing a reference voltage equivalent to the top of segment 4 to the top plates of the capacitor bank. If the signal level lies in the upper four segments, $V_{REF}$ is retained. If the signal level lies in segments 1, 2, 3, 4, $V_{REF}/16$ is used for the next two segment selection sequences. In addition, a small correction bias is applied via the switch S3.

In the fourth mode, the step is determined in a standard four sequence successive approximation algorithm similar to that used for segment selection, using the four capacitors lower in value than the highest values switched to $V_{REF}$ ($V_{REF}/16$).

A PREFERRED EMBODIMENT

In the method of sampling the input signal as described in the preceeding sections, the capacitor array is connected between an input signal $V_{IN}$ and ground by switches S1 and S2 (FIG. 4). After allowing enough time for the capacitors to change to $V_{IN}$, switches S1 and S2 are reversed and a potential equal to $-V_{IN}$ remains on the commonly connected plates of the capacitors at the input to the comparator 52. Since $V_{IN}$ can be either positive or negative, the resulting stored charge can also be either positive or negative necessitating the use of both positive and negative reference voltages for use in the successive approximation comparison process. Three positive and three negative reference voltages are in fact required in such encoder circuit as follows:

$$\pm V_{REF} \pm V_{REF}/16 \text{ and } \pm V1$$

Apart from generating these supplies, there is also a need to match accurately the positive and negative reference voltages to minimize distortion products.

The reference voltage generation is greatly simplified and mismatch between positive and negative supplies obviated by using a modified sample and hold circuit as shown in FIG. 5. Three time periods are shown (FIG. 6). During time period 1, switch S5 is closed, connecting $V_{IN}$ to the input to the comparator 52 for polarity determination according to the principles used in the earlier embodiments. The comparator output then switches to a logic "1" or a logic "0". This output is then used to determine the setting of the switches during period 2 depending on whether the input signal is positive or negative, as shown in FIG. 6. During period 2, the capacitor array is charged to $V_{IN}$. During period 3, the capacitor array is returned to the state required for the standard successive approximation encoding process described in detail in above mentioned references.

CONCLUSIONS

This invention utilizes a single capacitor bank (in lieu of multiple banks) and eliminates a buffer amplifier that had been used heretofore, in similar prior art devices, thus reducing overall circuit delay sufficiently to permit enhanced encoding speed and desired multi-channel operation.

Various modifications can be performed by those skilled in the art without departing from the spirit and scope of this invention as defined by the appended claims.

I claim:

1. A charge redistribution circuit for pulse-code modulation encoding comprising:
   a single binary weighted capacitor array for the generation of both segment and step boundaries of voice being encoded, each capacitor of said array having a pair of opposed plates, one plate of each of said capacitors being commonly coupled together;
   a binary comparator having a pair of inputs and an output, a first of said inputs being adapted to be coupled to a reference bias potential, and a second of said inputs being coupled to said commonly coupled plates of said capacitor array;
   means for receiving an input analog voice signal;
   first switching means for connecting said commonly coupled plates to ground potential and for disconnecting said plates from ground potential;
   a first common line;
   a second common line;
   second switching means for selectively connecting said first common line to said receiving means or to ground potential;
   third switching means for selectively connecting said second common line to a predetermined reference voltage $V_{REF}$, or to a reference voltage $V_{REF/n}$ which is one nth said predetermined voltage, and for selectively coupling said first comparator input to ground potential or to said reference bias potential;
   fourth switching means, including a switch for each said capacitor, for selectively coupling the other plates of each of said capacitors of said array to said first common line, or to said second common line;
   code generating means for providing a digital output upon receipt of a read instruction and control signals applied thereto; and
   control logic means for controlling said four switching means, responsive to the output of said comparator, and for providing control signals to said generating means, wherein n is a positive integer.

2. The circuit as recited in claim 1 further comprising fifth switching means for selectively connecting and disconnecting said receiving means with said commonly coupled plates, and
   wherein said control logic means is adapted to control said fifth switching means.

3. The circuit as recited in claim 2 wherein said control logic mean, initially, in a sample and hold determination, in sequence
   (1) for a first time period, causes said first switching means to disconnect said commonly coupled plates from ground potential, causes said second switching means to couple said first common line to said receiving means, causes said fourth switching means to couple said other plates to said first common line, and causes said fifth switching means to connect said commonly coupled plates to said receiving means, thus providing for a comparator output in either of two different logic states;
   (2) for a second time period, with a first logic state provided in (1) above, causes said first switching means to connect said commonly coupled plates to ground potential, causes said second switching means to continue to connect said first common line to said receiving means, and causes said fifth switching means to disconnect said commonly coupled plates from said receiving means; and with a second logic state provided in (1) above, causes said first switching means to continue to disconnect said commonly coupled plates from ground potential, causes said second switching means to couple said first common line to ground potential, and causes said fifth switching means to continue to connect said commonly coupled plates to said receiving means, thus charging said capacitor array; and (3) for a third time period, with said first logic state provided in (1) above, causes said first switching means to disconnect said commonly coupled plates from ground potential, causes said second switching means to connect said first common line to ground potential, and causes said fifth switching means to continue to disconnect said commonly coupled plates from said receiving means, and, with said second logic state provided as (1) above, causes said first switching means to continue to disconnect said commonly coupled plates from ground potential, causes said second switching means to continue to couple said first common line to ground potential, and causes said fifth switching means to disconnect said commonly coupled plates from said receiving means.

4. The circuit as recited in claim 1 wherein n equals $2^m$, wherein m is a positive integer.

5. The circuit as recited in claim 1 wherein n equals 16.

6. In apparatus for encoding voice in a companded code to maximize signal-to-noise performance, the companded code being the 15 segment approximation of the $\mu$255 compression law, each segment containing 16 equal size steps, a charge redistribution circuit for pulse-code modulation encoding comprising:

a single binary weighted capacitor array for the generation of both segment and step boundaries of voice being encoded, each capacitor of said array having a pair of opposed plates, one plate of each of said capacitors being commonly coupled together;

a binary comparator having a pair of inputs and and output, a first of said inputs being adapted to be coupled to a reference bias potential, and a second of said inputs being coupled to said commonly coupled plates of said capacitor array;

means for receiving an input analog voice signal;

first switching means for connecting said commonly coupled plates to ground potential and for disconnecting said plates from ground potential;

a first common line;

a second common line;

second switching means for selectively connecting said first common line to said receiving means or to ground potential;

third switching means for selectively connecting said second common line to a predetermined reference voltage $V_{REF}$, or to a reference voltage $V_{REF}/16$ which is one sixteenth said predetermined voltage, and for selectively coupling said first comparator input to ground potential or to said reference bias potential;

fourth switching means, including a switch for each said capacitor, for selectively coupling the other plates of each of said capacitors of said array to said first common line, or to said second common line;

eight bit code generating means for providing a digital 8 bit output upon receipt of a read instruction and control signals applied thereto; and control logic means for controlling said four switching means, responsive to the output of said comparator, and for providing control signals to said generating means.

7. In apparatus for encoding voice in a companded code to maximize signal-to-noise performance, the companded code being the 15 segment approximation of the $\mu$255 compression law, each segment containing 16 equal size steps, a charge redistribution circuit for pulse-code modulation encoding comprising:

a single binary weighted capacitor array for the generation of both segment and step boundaries of voice being encoded, each capacitor of said array having a pair of opposed plates, one plate of each of said capacitors being commonly coupled together;

a binary comparator having a pair of inputs and an output, a first of said inputs being adapted to be coupled to a reference bias potential, and a second of said inputs being coupled to said commonly coupled plates of said capacitor array;

means for receiving an input analog voice signal;

first switching means for connecting said commonly coupled plates to ground potential and for disconnecting said plates from ground potential;

a first common line;

a second common line;

second switching means for selectively connecting said first common line to said receiving means or to ground potential;

third switching means for selectively connecting said second common line to a predetermined reference voltage $V_{REF}$, or to a reference voltage $V_{REF}/16$ which is one-sixteenth said predetermined voltage, and for selectively coupling said first comparator input to ground potential or to said reference bias potential;

fourth switching means, including a switch for each said capacitor, for selectively coupling the other plates of each said capacitors of said array to said first common line, or to said second common line;

eight bit code generating means for providing a digital 8 bit output upon receipt of a read instruction and control signals applied thereto; and control logic means for controlling said four switching means, responsive to the output of said comparator, and for providing control signals to said generating means, said control logic means, in sequence, (1) causing said first switching means to connect said commonly coupled plates to ground potential, causing said fourth switching means to couple said other plates to said first common line, and causing said second switching means to connect said first common line to said receiving means, whereby said analog voice signal can be sampled and held as a charge stored on said capacitor array;

(2) causing said first switching means to disconnect said commonly connected plates from ground potential, and causing said second switching means to connect said first common line to ground potential, whereby the sign of the voltage on said second input of said comparator, as detected by said comparator, is the negative of the sign of said sampled analog voice signal, thereby determining the polarity and sign bit of the pulse-code-modulation;

(3) causing said third switching means to connect said second common line to said predetermined reference voltage $V_{REF}$, causing said fourth switching means to superimpose a reference voltage equivalent to the top of segment 4 to the commonly coupled plates of said capacitor array by connecting the four lower value capacitors to said second common line as an initial sequence of a standard three sequence segment selection successive approximation algorithm while the remainder of the array remains coupled to ground;

(4) causing said third switching means to continue to connect said second common line to said predetermined reference voltage $V_{REF}$ when the sampled input signal lies in the upper four segments, and for causing said third switching means to connect said second common line to said reference voltage $V_{REF}/16$ when the sampled input signal lies in the lower four segments; and, simultaneously, causing said third switching means to connect the first comparator input to ground when the sampled input signal lies in the upper four segments; and causing said third switching means to connect said first comparator input to a reference bias potential when the sampled input signal lies in the lower four segments; and causing fourth switching means as part of the second sequence of the standard three sequence segment-selection successive approximation algorithm to superimpose either a reference voltage equivalent to the top of segment 6 or segment 2 to the commonly coupled plates of said capacitor array, dependent upon whether the reference voltage $V_{REF}$ or the reference voltage $V_{REF}/16$, respectively, is coupled to said second common line of said capacitor array as a second sequence of a standard three sequence successive approximation algorithm for segment determination;

(5) causing said forth switching means either (a) to superimpose a reference voltage equivalent to the top of segments 7 or 5, dependent on the polarity of the comparator output, to the commonly coupled plates of the capacitor array, for the predetermined reference voltage $V_{REF}$, coupled to said second common line of said capacitor array, by connecting the lower 7 or 5 value capacitors to the second common line as a third sequence of a standard three sequence successive approximation algorithm for segment determination, or (b) to superimpose a reference voltage equivalent to the top of segments 3 or 1, dependent on the polarity of the comparator output, to the commonly coupled plates of the capacitor array, for the predetermined reference voltage $V_{REF}/16$, coupled to said second common line of said capacitor array, by connecting the lower 7 or 5, value capacitors to the second common line as a third sequence of a standard three sequence successive approximation algorithm for segment determination;

(6) causing said fourth switching means to superimpose a reference voltage to said commonly coupled plates of said capacitor array equivalent to the top of eight or middle step within the segment determined in the previous sequence, either by retaining unchanged the highest capacitor switched to said second common line, while concurrently causing the capacitor lower in value than the highest valued capacitor connected to said second common line to be switched to said first common line, or, dependent on the polarity of the comparator output at the end of said previous sequence, by causing the highest valued capacitor connected to said second common line to be switched to said first common line while concurrently connecting the next highest capacitor to said second common line, said switching of said fourth switching means being an initial sequence of a standard four sequence successive approximation algorithm for step determination;

(7) dependent upon the polarity of said output of said comparator at the end of the previous sequence, the control logic means either causes said fourth switching means to superimpose a reference voltage equivalent to the top of step 4 of the predetermined segment to said commonly coupled plates of said capacitor array by switching the next two highest capacitors below the highest capacitor switched to said second common line in the previous sequence to said first common line, or said control logic means causes said fourth switching means to superimpose a reference voltage equivalent to the top of step 12 of the predetermined segment to said commonly coupled plates of said capacitor array by switching the next highest capacitor below the highest capacitor switched to said second common line in the previous sequence to said second common line, concurrently switching the second highest capacitor below the highest capacitor switched to said second common line in the previous sequence to said first common line as a second sequence of the standard four sequence successive approximation algorithm for step determination, the algorithm for the four sequence step determination providing the relationship between the number of the step n within the predetermined segment whose reference voltage equivalent is switched to said commonly coupled plates of said capacitor array to the switching state of the four capacitors below the highest value capacitor switched to said second common line in the final segment determination sequence and is defined as:

$$n = 16 \left(1 - \frac{k_1}{2^1} - \frac{k_2}{2^2} - \frac{k_3}{2^3} - \frac{k_4}{2^4}\right)$$

wherein when $k_a = k_1, k_2, k_3, k_4 = 1$, the $a^{th}$ capacitor below the highest value capacitor switched to the second common line in the previous sequence is switched to the first common line, and wherein when $k_a = k_1, k_2, k_3, k_4 = 0$, the $a^{th}$ capacitor below the highest value capacitor switched to the second common line in the previous sequence is switched to the second common line (8) causing said fourth switching means to superimpose a reference voltage equivalent to the top of steps 2, 6, 10 or 14 of the predetermined segment to said commonly coupled plates of said capacitor array as a third sequence of said standard four sequence successive approximation algorithm;

(9) causing said fourth switching means to superimpose reference voltage equivalent to the top of steps 1, 3, 5, 7, 9, 11, 13 or 15 of the predetermined segment to said commonly coupled plates of said capacitor array as a fourth sequence of said standard four sequence successive approximation algorithm; and

(10) causing said circuit to present an eight-bit digitally encoded output word and to reset said circuit for a subsequent pulse-code-modulation encoding.

8. The circuit as recited in claim 7 further comprising fifth switching means for selectively connecting and disconnecting said receiving means with said commonly coupled plates, and wherein said control logic means is adapted to control said fifth switching means.

9. The circuit as recited in claim 8 wherein
(1) for a first time period, causes said first switching means to disconnect said commonly coupled plates from ground potential, causes said second switching means to couple said first common line to said receiving means, causes said fourth switching means to couple said other plates to said first common line, and causes said fifth switching means to connect said commonly coupled plates to said receiving means, thus providing for a comparator output in either of two different logic states;
(2) for a second time period, with a first logic state provided in (1) above, causes said first switching means to connect said commonly coupled plates to ground potential, causes said second switching means to continue to connect said first common line to said receiving means, and causes said fifth switching means to disconnect said commonly coupled plates from said receiving means; and with a second logic state provided in (1) above, causes said first switching means to continue to disconnect said commonly coupled plates from ground potential, causes said second switching means to couple said first common line to ground potential, and causes said fifth switching means to continue to connect said commonly coupled plates to said receiving means, thus charging said capacitor array; and
(3) for a third time period, with said first logic state provided in (1) above, causes said first switching means to disconnect said commonly coupled plates from ground potential, causes said second switching means to connect said first common line to ground potential, and causes said fifth switching means to continue to disconnect said commonly coupled plates from said receiving means, and, with said second logic state provided as (1) above, causes said first switching means to continue to disconnect said commonly coupled plates from ground potential, causes said second switching means to continue to couple said first common line to ground potential, and causes said fifth switching means to disconnect said commonly coupled plates from said receiving means.

* * * * *